(12) United States Patent
Mallick et al.

(10) Patent No.: US 8,765,573 B2
(45) Date of Patent: Jul. 1, 2014

(54) AIR GAP FORMATION

(75) Inventors: Abhijit Basu Mallick, Palo Alto, CA (US); Nitin Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/229,673

(22) Filed: Sep. 10, 2011

(65) Prior Publication Data

US 2012/0070957 A1  Mar. 22, 2012

Related U.S. Application Data

(60) Provisional application No. 61/384,650, filed on Sep. 20, 2010.

(51) Int. Cl.
| | |
|---|---|
| *H01L 21/00* | (2006.01) |
| *H01L 21/768* | (2006.01) |
| *H01L 21/02* | (2006.01) |
| *H01L 21/764* | (2006.01) |

(52) U.S. Cl.
CPC ........ *H01L 21/764* (2013.01); *H01L 21/76837* (2013.01); *H01L 21/02208* (2013.01); *H01L 21/7682* (2013.01); *H01L 2221/1047* (2013.01); *H01L 21/02126* (2013.01); *H01L 21/02211* (2013.01); *H01L 21/02271* (2013.01); *H01L 21/02203* (2013.01)
USPC .................... 438/422; 438/421; 257/E21.573

(58) Field of Classification Search
CPC .............. H01L 21/764; H01L 21/7682; H01L 21/76264
USPC ................................................ 438/478–509
See application file for complete search history.

(56) References Cited

U.S. PATENT DOCUMENTS

| | | | | |
|---|---|---|---|---|
| 5,461,003 | A | * | 10/1995 | Havemann et al. ........... 438/666 |
| 6,265,321 | B1 | | 7/2001 | Chooi et al. |
| 6,287,979 | B1 | | 9/2001 | Zhou et al. |
| 6,555,467 | B2 | | 4/2003 | Hsu et al. |
| 6,872,654 | B2 | | 3/2005 | Chen et al. |
| 7,022,582 | B2 | | 4/2006 | Sezi |
| 7,041,571 | B2 | | 5/2006 | Strane et al. |
| 7,256,127 | B2 | * | 8/2007 | Gallagher et al. ............ 438/694 |
| 7,582,555 | B1 | | 9/2009 | Lang et al. |

(Continued)

OTHER PUBLICATIONS

On Distributions of Defect States in Low-k Carbon Doped Silicon Dioxide Films in Vicinity of Fermi Level V. Ligatchevz and T. K. S. Wong* doi: 10.1149/1.1819851 Electrochem. Solid-State Lett. 2004, vol. 7, Issue 12, pp. F89-F92.*

(Continued)

*Primary Examiner* — Seahvosh Nikmanesh
*Assistant Examiner* — Evren Seven
(74) *Attorney, Agent, or Firm* — Kilpatrick Townsend & Stockton LLP

(57) ABSTRACT

A method of forming air gaps between adjacent raised features on a substrate includes forming a carbon-containing material in a bottom region between the adjacent raised features using a flowable deposition process. The method also includes forming a silicon-containing film over the carbon-containing material using a flowable deposition process, where the silicon-containing film fills an upper region between the adjacent raised features and extends over the adjacent raised features. The method also includes curing the carbon-containing material and the silicon-containing material at an elevated temperature for a period of time to form the air gaps between the adjacent raised features.

20 Claims, 6 Drawing Sheets

(56) References Cited

U.S. PATENT DOCUMENTS

| | | |
|---|---|---|
| 7,666,754 B2 | 2/2010 | Toma et al. |
| 7,781,301 B2 | 8/2010 | Watanabe et al. |
| 7,781,352 B2 * | 8/2010 | Fukazawa et al. ............ 438/792 |
| 7,790,634 B2 | 9/2010 | Munro et al. |
| 2007/0010072 A1 * | 1/2007 | Bailey et al. .................. 438/478 |
| 2010/0081293 A1 * | 4/2010 | Mallick et al. ................ 438/794 |
| 2011/0221062 A1 * | 9/2011 | Clevenger et al. ............ 257/750 |

OTHER PUBLICATIONS

International Search Report and Written Opinion of the International Searching Authority for PCT Application No. PCT/US2011/051226, mailed on Apr. 24, 2012, 11 pages.

Non-Final Office Action of Dec. 23, 2013 for U.S. Appl. No. 13/834,508, 14 pages.

* cited by examiner

AIR GAP FORMATION

CROSS-REFERENCES TO RELATED APPLICATIONS

This application claims the benefit of U.S. provisional patent Application No. 61/384,650, filed Sep. 20, 2010, titled "Enabling Air Gap Formation for Advanced Cu Interconnects," the entire contents of which are incorporated herein by reference for all purposes.

BACKGROUND

Embodiments of the present invention relate to methods of forming low dielectric constant materials, such as air gaps, between adjacent raised features on substrates.

Semiconductor device geometries have dramatically decreased in size since their introduction several decades ago. Modern semiconductor fabrication equipment is routinely used to produce devices having geometries as small as 28 nm and less, and new equipment designs are continually being developed and implemented to produce devices with even smaller geometries. As device geometries decrease, the impact of interconnect capacitance on device performance increases. To reduce interconnect capacitance, inter-layer materials that have traditionally been formed of silicon oxide are being formed using lower dielectric constant materials (low k materials). Some low k materials that have been used include fluorinated silicon oxide, carbonated silicon oxide, and various polymers and aerogels. Use of these low k materials often presents serious reliability, manufacturability, and/or integration challenges.

One of the challenges is filling spaces between adjacent raised features (e.g., trenches and/or metal lines) with the low k materials. This is becoming more difficult as device geometries decrease and aspect ratios increase. The low k materials often pinch off at a top before the spaces completely fill leaving voids. In smaller spaces, the low k materials may completely pinch off at the top sealing the voids. In larger spaces, the low k material may not completely pinch off at the top thus leaving openings into the voids. Because semiconductor devices include both smaller and larger spaces, shapes of the voids are difficult to control. This leads to additional reliability and/or integration challenges.

Thus, there is a need for low k materials that can fill spaces between adjacent raised features without leaving voids of different shapes.

SUMMARY

Methods of the present invention form air gaps (e.g., spaces comprising a vacuum or gas) between adjacent raised features on substrates. In one embodiment, the air gaps comprise one or more pores of a porous low k material. In another embodiment, the air gaps extend substantially from a first raised feature to a second adjacent raised feature. The air gaps can have a dielectric constant as low as 1.0, thus reducing interconnect capacitance. Also, the air gaps can be formed with a consistent shape that is independent of size of the space.

In accordance with an embodiment of the present invention, a method of forming air gaps between adjacent raised features on a substrate includes forming a carbon-containing material in a bottom region between the adjacent raised features using a flowable deposition process. The method also includes forming a silicon-containing film over the carbon-containing material using a flowable deposition process. The silicon-containing film may fill an upper region between the adjacent raised features and extend over the adjacent raised features. The method also includes curing the carbon-containing material and the silicon-containing material at an elevated temperature for a period of time to form the air gaps between the adjacent raised features.

In an embodiment, the carbon-containing material is formed using a flowable chemical vapor deposition (CVD) process.

In another embodiment, the carbon-containing material comprises silicon, oxygen, and carbon.

In another embodiment, the carbon-containing material is substantially free of silicon.

In another embodiment, the cure removes carbon from the carbon-containing material to provide a porous oxide and the air gaps comprises one or more pores of the porous oxide.

In another embodiment, the carbon-containing material is substantially removed during the cure such that at least one of the air gaps extend from a first one of the adjacent raised features to a second one of the adjacent raised features.

In another embodiment, the silicon-containing film is formed using a flowable CVD process.

In another embodiment, the silicon-containing film consists essentially of silicon oxide.

In another embodiment, the silicon-containing film is substantially free of carbon.

In yet another embodiment, a density of the silicon-containing film increases after the cure and the silicon-containing film extends over the air gaps.

In accordance with another embodiment of the present invention, a method of forming air gaps between adjacent raised features on a substrate includes forming a hydrocarbon material in a bottom region between the adjacent raised features using a flowable deposition process. The hydrocarbon material may be substantially free of silicon. The method also includes forming a silicon-containing film over the hydrocarbon material using a flowable chemical vapor deposition (CVD) process. The silicon-containing film may fill an upper region between the adjacent raised features and extend over the adjacent raised features. The silicon-containing film may be substantially free of carbon. The method also includes curing the hydrocarbon material and the silicon-containing material at an elevated temperature for a period of time to form the air gaps between the adjacent raised features. The elevated temperature may be higher than a decomposition temperature of the hydrocarbon material, and the hydrocarbon material may be substantially removed during the cure such that at least one of the air gaps extend from a first one of the adjacent raised features to a second one of the adjacent raised features.

In an embodiment, the hydrocarbon material is formed using a flowable CVD process.

In another embodiment, a density of the silicon-containing film increases after the cure and the silicon-containing film extends over the air gaps.

In accordance with another embodiment of the present invention, a method of forming air gaps between adjacent raised features on a substrate includes forming a carbon-doped silicon oxide material in a bottom region between the adjacent raised features using a flowable deposition process. The method also includes forming a silicon-containing film over the carbon-doped silicon oxide material using a flowable CVD process. The silicon-containing film may fill an upper region between the adjacent raised features and extend over the adjacent raised features. The silicon-containing film may also be substantially free of carbon. The method also includes curing the carbon-doped silicon oxide material and the silicon-containing material at an elevated temperature for a period of time to form the air gaps between the adjacent raised features. The cure may remove carbon from the carbon-doped silicon oxide material to provide a porous oxide, and the air gaps may comprise one or more pores of the porous oxide.

In an embodiment, the carbon-containing material is formed using a flowable CVD process.

In another embodiment, a density of the silicon-containing film increases after the cure and the silicon-containing film extends over the air gaps.

Additional embodiments and features are set forth in the description that follows and will become apparent to those skilled in the art upon examination of the specification. Features and advantages may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and drawings. Like reference numerals are used throughout the several drawings to refer to similar components.

DETAILED DESCRIPTION

Methods of the present invention reduce interconnect capacitance by forming air gaps between adjacent raised features on substrates. The air gaps may comprise a vacuum or gas. The air gaps may be formed, for example, in trenches or between metal lines during manufacture of semiconductor devices. In one embodiment, the air gaps comprise one or more pores of a porous low k material. In another embodiment, the air gaps extend substantially from a first raised feature to a second adjacent raised feature. The air gaps may be formed using flowable materials that provide air gaps having a consistent shape despite being formed in spaces of different sizes.

Figure 1A:
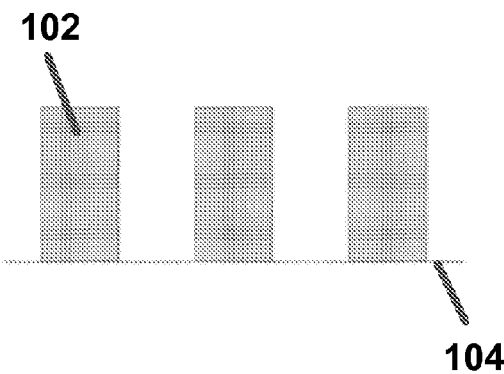
FIGS. 1A-1D are simplified cross-sectional drawings illustrating a method of forming air gaps between adjacent raised features on a substrate according to an embodiment of the invention.

FIGS. 1A-1D are simplified cross-sectional drawings illustrating a method of forming air gaps between adjacent raised features on a substrate according to an embodiment of the invention. FIG. 1A shows raised features 102 on a substrate 104. Only a surface of the substrate 104 is shown. The raised features 102 may be metal lines on a surface of the substrate 104, conductive lines overlaying devices formed in or on the substrate 104, trenches formed in an upper portion of the substrate 104, or the like. The substrate 104 may be used, for example, to make semiconductor devices, flat panel displays (such as TFTs), energy conversion and storage devices (e.g., photovoltaic or fuel cells), solid-state lighting (e.g., LEDs and OLEDs), magnetic and optical storage devices, micro-electro-mechanical systems (MEMS), and the like.

Figure 1B:
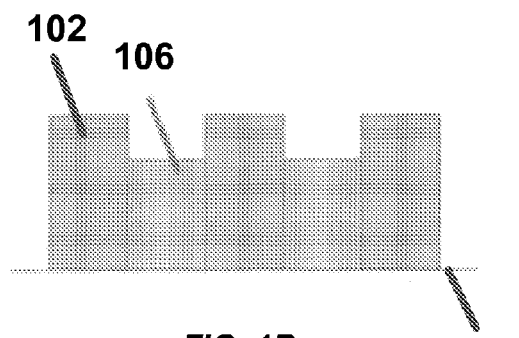

FIG. 1B shows a carbon-containing material formed between the raised features. In this example, the carbon-containing material is a carbon-doped silicon oxide material. The carbon-doped silicon oxide material 106 may be formed using a flowable chemical vapor deposition (CVD) process as described more fully below. The carbon-doped silicon oxide material 106 may include primarily silicon, oxygen, carbon, and hydrogen. As shown in this figure, the carbon-doped silicon oxide material 106 may fill a bottom region between adjacent raised features. When the carbon-doped silicon oxide material 106 is formed using a flowable deposition process, the carbon-doped silicon oxide material 106 fills the spaces between the adjacent raised features from a bottom upward. The spaces are filled to a level that is approximately the same regardless of the width or shape of the space.

Figure 1C:
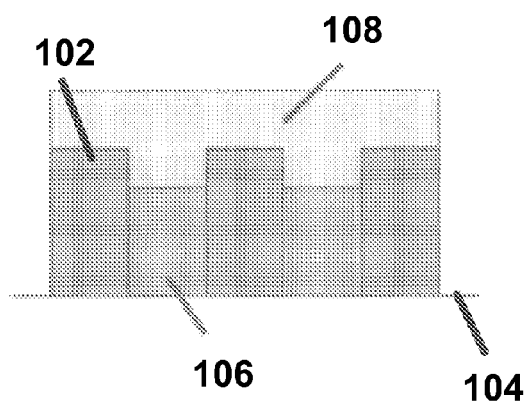

FIG. 1C shows a silicon-containing film 108 formed over the carbon-doped silicon oxide material 106. The silicon-containing film 108 may be formed using a flowable CVD process as described more fully below. The silicon-containing film 108 may fill an upper region between the raised features 102 and extend over the raised features 102. In an embodiment, the silicon-containing film 108 includes primarily silicon oxide and is substantially free of carbon.

Figure 1D:
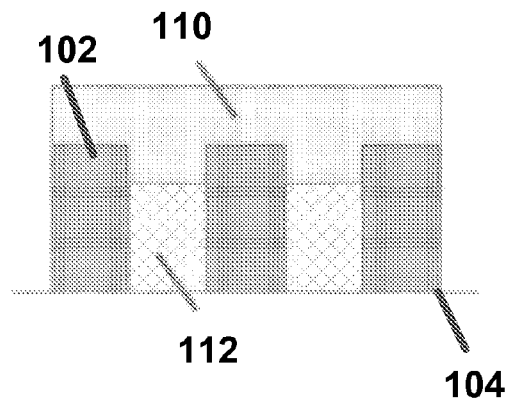

The silicon-containing film 108 and the carbon-doped silicon oxide material 106 may be exposed to a cure process to provide a densified oxide 110 overlying a porous oxide 112 as shown in FIG. 1D. The cure process may include exposure to an oxygen-containing atmosphere at an elevated temperature, where the oxygen reacts with carbon in the carbon-doped silicon oxide material 106 to provide carbon dioxide and water. Alternatively, the cure process may include exposure to a non-oxidizing atmosphere at an elevated temperature, where the silicon-carbon bonds are thermally cleaved. The elevated temperature may range from about 200° C. to about 1100° C. (e.g., above one of 200° C., 300° C., 400° C., 500° C., 600° C., 700° C., 800° C., 900° C., or 1000° C. in different embodiments). The oxygen-containing atmosphere may include substantially pure oxygen in the form of atomic oxygen (O), molecular oxygen ($O_2$), ozone ($O_3$), and mixtures thereof. The atmosphere may also contain a mixture of oxygen and steam ($H_2O$) and/or oxygen and an inert gas. The non-oxidizing atmosphere may include hydrogen ($H_2$), helium (He), nitrogen ($N_2$), argon (Ar), and/or other non-oxidizing gases.

The carbon dioxide and water formed during the cure process with the oxygen-containing atmosphere are volatile and diffuse out through the silicon-containing film 108. This leaves pores in the porous oxide 112. The porous oxide 112 may comprise mostly silicon oxide. The pores may comprise a vacuum or gas depending on process conditions of the cure process. The oxygen also reacts with silicon in the silicon-containing film 108 to provide silicon oxide (or densified oxide 110). In general, the oxygen reacts more quickly with carbon in the carbon-doped silicon oxide material 106 than with silicon in the silicon-containing film 108. This allows the carbon dioxide and water to diffuse out through the silicon-containing film 108 before or during formation of the densified oxide 110.

In this embodiment, the air gaps formed between the raised features 102 may comprises one or more pores of the porous oxide 112. A carbon content of the carbon-doped silicon oxide material 106 and conditions of the cure process (e.g., ambient, temperature, pressure, and the like) can be modified to alter a size and concentration of the pores. This in turn alters a dielectric constant of the porous oxide 112. One of ordinary skill in the art would appreciate that a volume of the porous oxide 112 compared to a volume of the space between the raised features 102 will impact an effective interconnect capacitance of the composite gapfill material (i.e., the densified oxide 110 and the porous oxide 112 between the raised features 102). This embodiment provides a low k material (i.e., the porous oxide 112) between the raised features 102 and a densified oxide 110 between the raised features 102 and between any overlying layers. The densified oxide 110 provides structural integrity between the raised features 102 and any overlying layers. The densified oxide 110 also protects the porous oxide 112 from moisture and other contaminants that the porous oxide 112 might otherwise be exposed to following the cure process.

Figure 2A:
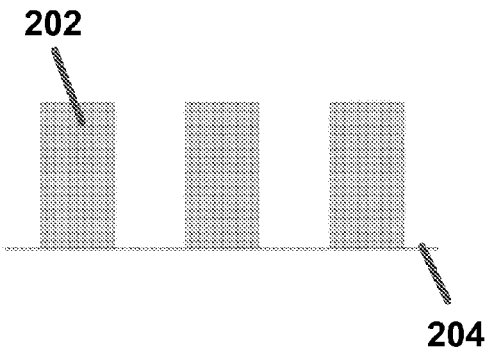
FIGS. 2A-2D are simplified cross-sectional drawings illustrating a method of forming air gaps between adjacent raised features on a substrate according to another embodiment of the invention.
Figure 2B:
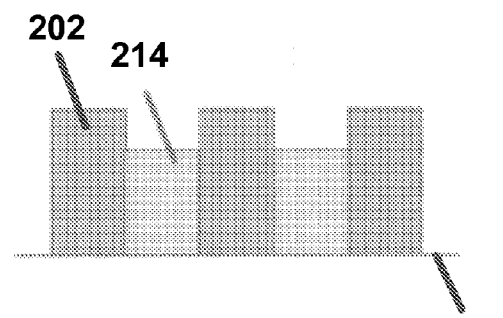

FIGS. 2A-2D are simplified cross-sectional drawings illustrating a method of forming air gaps between adjacent raised features on a substrate according to another embodiment of the invention. FIG. 2A shows raised features 202 on a substrate 204. Once again, only a surface of the substrate 204 is shown. FIG. 2B shows a carbon-containing material formed between the raised features. In this example, the carbon-containing material is a hydrocarbon material. The hydrocarbon material 214 may be formed using a flowable CVD process similar to the carbon-doped silicon oxide material 106 discussed above with reference to FIGS. 1B-1C. Alternatively, the hydrocarbon material 214 may be formed using a conventional spin-on deposition process. The hydrocarbon material 214 may include primarily carbon and hydrogen. As shown in this figure, the hydrocarbon material 214 may fill a bottom region between adjacent raised features. When the hydrocarbon material 214 is formed using a flowable or spin-on deposition process, the hydrocarbon material 214 fills the spaces between the adjacent raised features from a bottom upward. The spaces are filled to a level that is approximately the same regardless of the width or shape of the space.

Figure 2C:
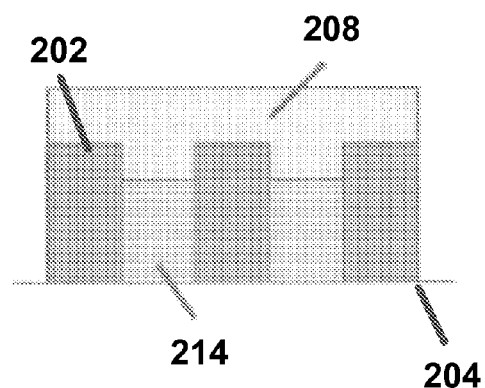

FIG. 2C shows a silicon-containing film 208 formed over the hydrocarbon material 214. The silicon-containing film 208 may be formed using a flowable CVD process as described more fully below. The silicon-containing film 208 may fill an upper region between the raised features 202 and extend over the raised features 202. In an embodiment, the silicon-containing film 208 is substantially free of carbon.

Figure 2D:
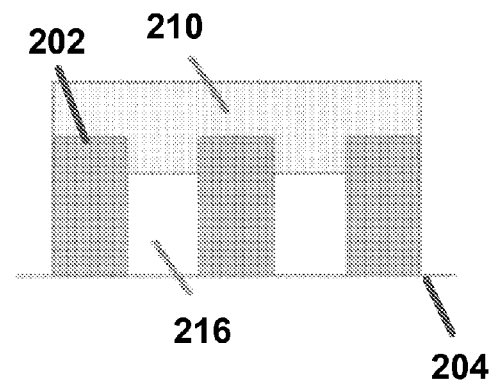

The silicon-containing film 208 and the hydrocarbon material 214 are exposed to a cure process to provide a densified oxide 210 overlying air gaps 216 as shown in FIG. 2D. In this example, the cure process may include exposure to an oxygen-containing atmosphere at an elevated temperature, where the oxygen reacts with carbon in the hydrocarbon material 214 to provide carbon dioxide and water. The carbon dioxide and water are volatile and diffuse out through the silicon-containing film 208. This leaves the air gaps 216 extending between the raised features 202. The air gaps may comprise a vacuum or gas depending on process conditions of the cure process. The oxygen also reacts with silicon in the silicon-containing film 208 to provide silicon oxide (or densified oxide 210).

In this embodiment, the air gaps 216 formed between the raised features 102 may extend substantially between the raised features 202. One of ordinary skill in the art would appreciate that a volume of the air gaps 216 compared to a volume of the space between the raised features 202 will impact an effective interconnect capacitance of the composite gapfill material (i.e., the densified oxide 210 and the air gaps 216 between the raised features 202).

Figures 3A, 3B:
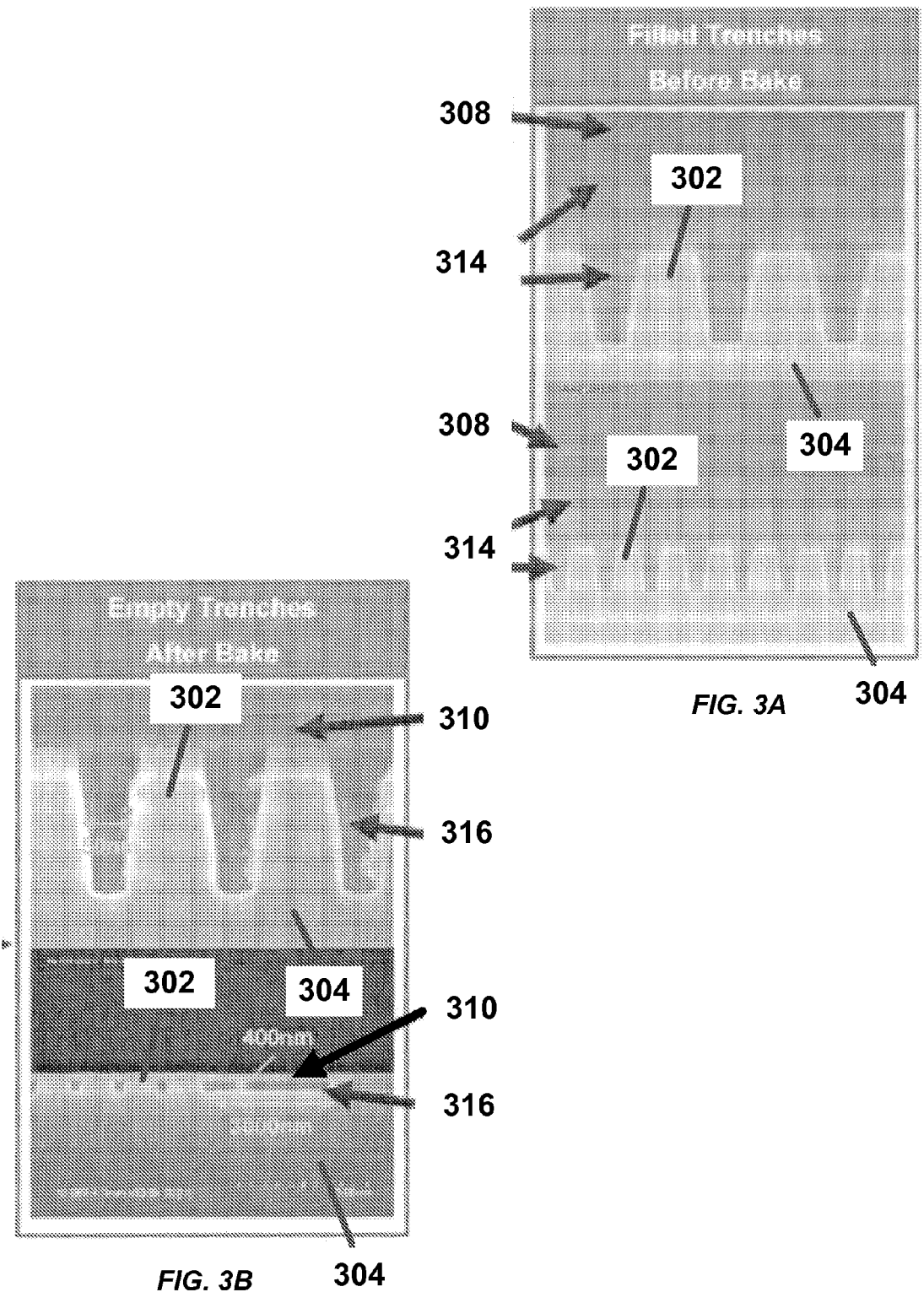
FIGS. 3A-3B are magnified images showing air gaps between adjacent raised features on a substrate according to an embodiment of the invention.

FIGS. 3A-3B are magnified images showing air gaps between adjacent raised features on a substrate according to an embodiment of the invention. FIGS. 3A-3B each include a higher magnification image above of a lower magnification image. The images shown in FIG. 3A are prior to a cure process, and the images shown in FIG. 3B are after a cure process.

FIG. 3A shows raised features 302 on a substrate 304. Only a portion of the substrate 304 is shown. In this example, the raised features 302 are trenches formed in a upper portion of the substrate 304. FIG. 3A shows a hydrocarbon material 314 formed between the raised features 302. In this example, the hydrocarbon material 314 fills the entire space between the raised features 302 and also covers the raised features 302. A silicon-containing film 308 is formed over the hydrocarbon material 314. In this example, the hydrocarbon material 314 includes primarily carbon and hydrogen, and the silicon-containing film 208 is substantially free of carbon.

FIG. 3B shows the raised features 302 on the substrate 304 after a cure process. The cure process in this example includes exposure to an oxygen-containing atmosphere at a temperature of about 550° C. The cure process removes substantially all of the hydrocarbon material 314 to form air gaps 316 between the raised features 302. The air gaps extend substantially from a first raised feature to a second adjacent raised feature. A densified oxide 310 is formed over the air gaps 316. As shown in FIG. 3B, the air gaps 316 are formed in both smaller and larger spaces between the raised features 302. Also, the air gaps 316 are formed without collapse, delamination, or cracking of the densified oxide 310.

Flowable Carbon-Doped Silicon Oxide Formation

An exemplary method of forming a flowable carbon-doped silicon oxide film includes providing a silicon precursor to a reaction chamber. The silicon precursor may include one or more carbon-containing organo-silicon compounds. The silicon precursor may also include a non-carbon containing silicon compound such as silane ($SiH_4$). The organo-silicon containing compounds may include those with direct Si—C bonding and/or those with Si—O—C bonding. Examples of organosilane silicon precursors include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, and mixtures thereof, among others.

The organo-silicon precursor may be mixed with a carrier gas before or during its introduction to the deposition chamber. A carrier gas may be an inactive gas that does not unduly interfere with the formation of the oxide film on the substrate. Examples of carrier gases include helium, hydrogen, neon, argon, and nitrogen, among other gases.

An oxygen-containing precursor may also be introduced to the substrate containing reaction chamber. The oxygen containing precursor may include atomic oxygen remotely generated outside the deposition chamber. The atomic oxygen may be generated by the dissociation of a precursor such as molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the precursor to generate the atomic oxygen may also be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

In some embodiments, the atomic oxygen and organo-silicon precursors are not mixed before being introduced to the deposition chamber. The precursors may enter the chamber through spatially separated precursor inlets distributed around reaction chamber. For example, the atomic oxygen precursor may enter from an inlet (or inlets) at the top of the chamber and positioned directly above the substrate. The inlet(s) may direct the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

Additional embodiments include introducing the atomic oxygen and silicon precursors through separate ports of a multi-port showerhead. For example, a showerhead positioned above the substrate may include a pattern of openings for the precursors to enter the deposition chamber. One subset of openings may be supplied for the atomic oxygen precursor, while a second subset of openings may be supplied for the silicon precursor. Precursors traveling through different sets of opening may be fluidly isolated from each other until exiting into the deposition chamber.

As the atomic oxygen and silicon precursors react in the deposition chamber, they form carbon-doped silicon oxide on the substrate deposition surface. During the initial deposition, the substrate may be held a constant and relatively low temperature (e.g., about 30° C. to about 70° C.). The initial oxide layer has excellent flowability, and can quickly migrate to the bottoms of the gaps in the structures on the substrate surface.

Flowable Silicon-Containing Formation

An exemplary method of forming a flowable silicon-containing film includes providing a carbon-free silicon precursor to a reaction chamber. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of additional gases may include hydrogen, nitrogen, ammonia, helium, argon, among other gases. Examples of carbon-free silicon precursors may also include silane ($SiH_4$) either alone or mixed with other silicon-containing gases (e.g., $N(SiH_3)_3$), hydrogen-containing gases (e.g., $H_2$), and/or nitrogen-containing gases (e.g., $N_2$, $NH_3$). Carbon-free silicon precursors may also include disilane, trisilane, higher-order silanes, and chlorinated silanes, alone or in combination with one another or the previously mentioned carbon-free silicon precursors.

The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

A radical-nitrogen precursor is also provided to the reaction chamber. The radical-nitrogen precursor is a nitrogen-radical containing species generated outside the reaction chamber from a more stable nitrogen precursor. For example, a relatively stable nitrogen precursor such a $NH_3$ and/or hydrazine ($N_2H_4$) may be activated in a plasma unit outside the reaction chamber to form the radical-nitrogen precursor, which is then transported into the reaction chamber. The stable nitrogen precursor may also be a mixture comprising $NH_3$ & $N_2$, $NH_3$ & $H_2$, $NH_3$ & $N_2$ & $H_2$, and $N_2$ & $H_2$, in different embodiments. Hydrazine may also be used in place of or in combination with $NH_3$ in the mixtures with $N_2$ and $H_2$. The radical-nitrogen precursor produced may be one or more of .N, .NH, .$NH_2$, etc., and may also be accompanied by ionized species formed in the plasma.

A radical precursor may be a radical-nitrogen precursor if it includes nitrogen supplied with the aforementioned precursors to the remote plasma region. Generally speaking, a radical precursor which does not include nitrogen will also allow a silicon-and-nitrogen-containing layer to be formed. The radical precursor is generated in a section of the reaction chamber partitioned from a deposition region where the precursors mix and react to deposit the silicon-and-nitrogen layer on a deposition substrate (e.g., a semiconductor wafer). In an embodiment where the radical precursor is a radical-nitrogen precursor, a stable nitrogen precursor is flowed into the remote plasma region and excited by a plasma. The stable nitrogen precursor (and the radical-nitrogen precursor) may also be accompanied by a carrier gas such as hydrogen, nitrogen, argon, helium, etc. A radical-nitrogen precursor formed from an input gas consisting essentially of nitrogen ($N_2$) (with or without additional inert carrier gases) has also been found to produce beneficial films. The radical-nitrogen precursor may also be replaced by a radical precursor formed from an input gas consisting essentially of hydrogen ($H_2$) (and optionally inert carrier gases) in embodiments where the silicon-containing precursor comprises nitrogen.

In the reaction chamber, the carbon-free silicon precursor and the radical-nitrogen precursor mix and react to deposit a silicon-and-nitrogen containing film on the deposition substrate. The deposited silicon-and-nitrogen containing film has flowable characteristics unlike conventional silicon nitride ($Si_3N_4$) film deposition techniques. The flowable nature of the formation allows the film to flow into narrow gaps and/or trenches and other structures on the deposition surface of the substrate.

The flowability may be due to a variety of properties which result from mixing a radical-nitrogen precursors with carbon-free silicon precursor. These properties may include a significant hydrogen component in the deposited film and/or the presence of short chained polysilazane polymers. These short chains grow and network to form more dense dielectric material during and after the formation of the film. For example, the deposited film may have a silazane-type, Si—NH—Si backbone (i.e., a Si—N—H film). When both the silicon precursor and the radical-nitrogen precursor are carbon-free, the deposited silicon-and-nitrogen containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however is much less than would be found in a silicon precursor having a carbon moiety (e.g., TEOS, TMDSO, etc.).

The chamber plasma region or a region in an remote plasma system may be referred to as a remote plasma region. In some embodiments, the radical-nitrogen precursor is created in the remote plasma region and travels into the substrate processing region where the carbon-free silicon-containing precursor is excited by the radical-nitrogen precursor. In some embodiments, the carbon-free silicon-containing precursor is excited only by the radical-nitrogen precursor. Plasma power may essentially be applied only to the remote plasma region to ensure that the radical-nitrogen precursor provides the dominant excitation to the carbon-free silicon-containing precursor.

In embodiments employing a chamber plasma region, the excited plasma effluents are generated in a section of the substrate processing region partitioned from a deposition region. The deposition region, also known herein as the substrate processing region, is where the plasma effluents mix and react with the carbon-free silicon-containing precursor to deposit the silicon-and-nitrogen layer on a deposition substrate. The excited plasma effluents are also accompanied by an inert gases. The carbon-free silicon-containing precursor does not pass through a plasma before entering the substrate plasma region, in some embodiments. The substrate processing region may be described herein as "plasma-free" during the growth of the silicon-and-nitrogen-containing layer. "Plasma-free" does not necessarily mean the region is devoid of plasma. Ionized species and free electrons created within the plasma region do travel through apertures in the showerhead. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film.

Exemplary Deposition System

Processing chambers that may be used to deposit flowable layers in accordance with embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples include the CENTURA ULTIMA® HDP-CVD chambers/systems, and PRODUCER® PECVD chambers/systems, available from Applied Materials, Inc. of Santa Clara, Calif.

Figure 4:
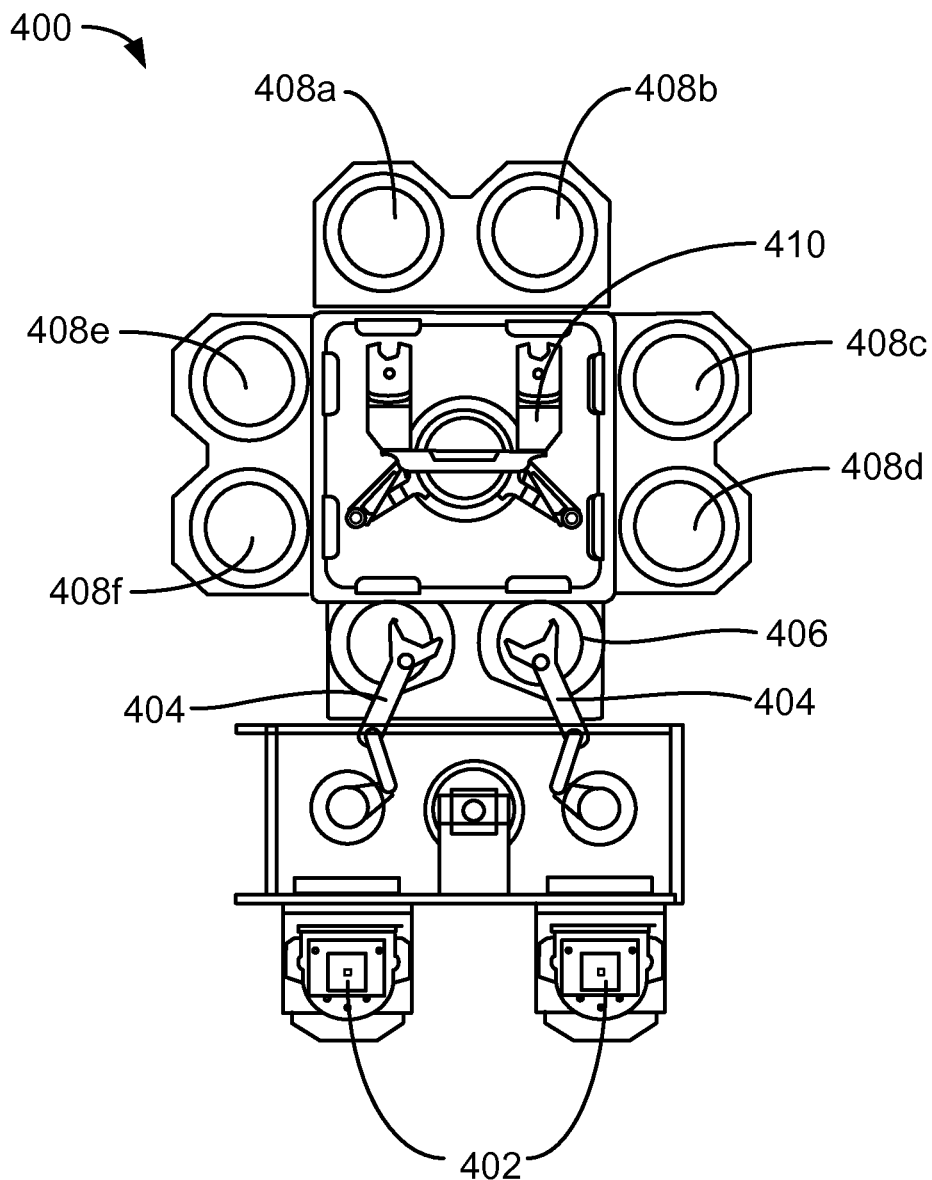
FIG. 4 is a simplified diagram of a substrate processing system that may be used to form air gaps between adjacent raised features according to embodiments of the invention.

The processing chambers may be incorporated into larger fabrication systems for producing integrated circuit chips. FIG. 4 shows one such system 400 of deposition, baking, and curing chambers. In the figure, a pair of FOUPs (front opening unified pods) 402 supply, substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing, and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

In addition, one or more of the process chambers 408a-f may be configured as a wet treatment chamber. These process chambers include heating the flowable dielectric film in an atmosphere that includes moisture. Thus, embodiments of system 400 may include wet treatment chambers 408a-b and anneal processing chambers 408c-d to perform both wet and dry anneals on the deposited dielectric film.

Figure 5A:
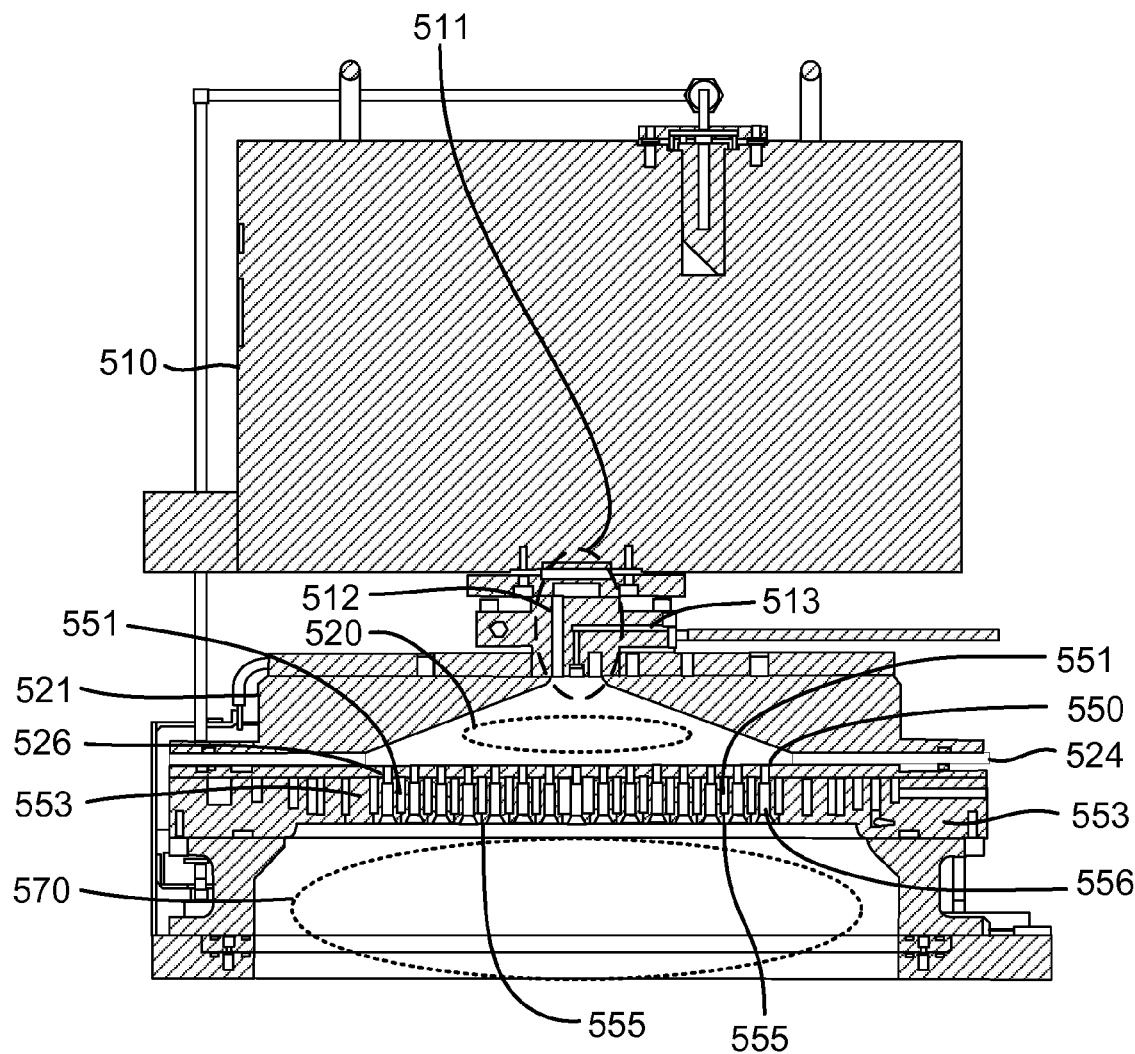
FIG. 5A is a simplified diagram of a substrate processing chamber that may be used to form air gaps between adjacent raised features according to embodiments of the invention.

FIG. 5A is a simplified diagram of an exemplary substrate processing chamber 500. A remote plasma system (RPS) 510 may process a gas which then travels through a gas inlet assembly 511. Two distinct gas supply channels are visible within the gas inlet assembly 511. A first channel 512 carries a gas that passes through the RPS 510, while a second channel 513 bypasses the RPS 510. First channel 512 may be used for the process gas and second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this example. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less this example.

In the example shown, showerhead 553 may distribute (via through holes 556) process gases which contain oxygen, hydrogen, nitrogen, and/or plasma effluents of such process gases upon excitation by a plasma in chamber plasma region 520. In some embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 513 may also deliver a process gas, a carrier gas, and/or a film-curing gas used to remove an unwanted component from the growing or as-deposited film. Plasma effluents may include ionized or neutral derivatives of the process gas and may also be referred to herein as a radical-oxygen precursors and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in this example. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
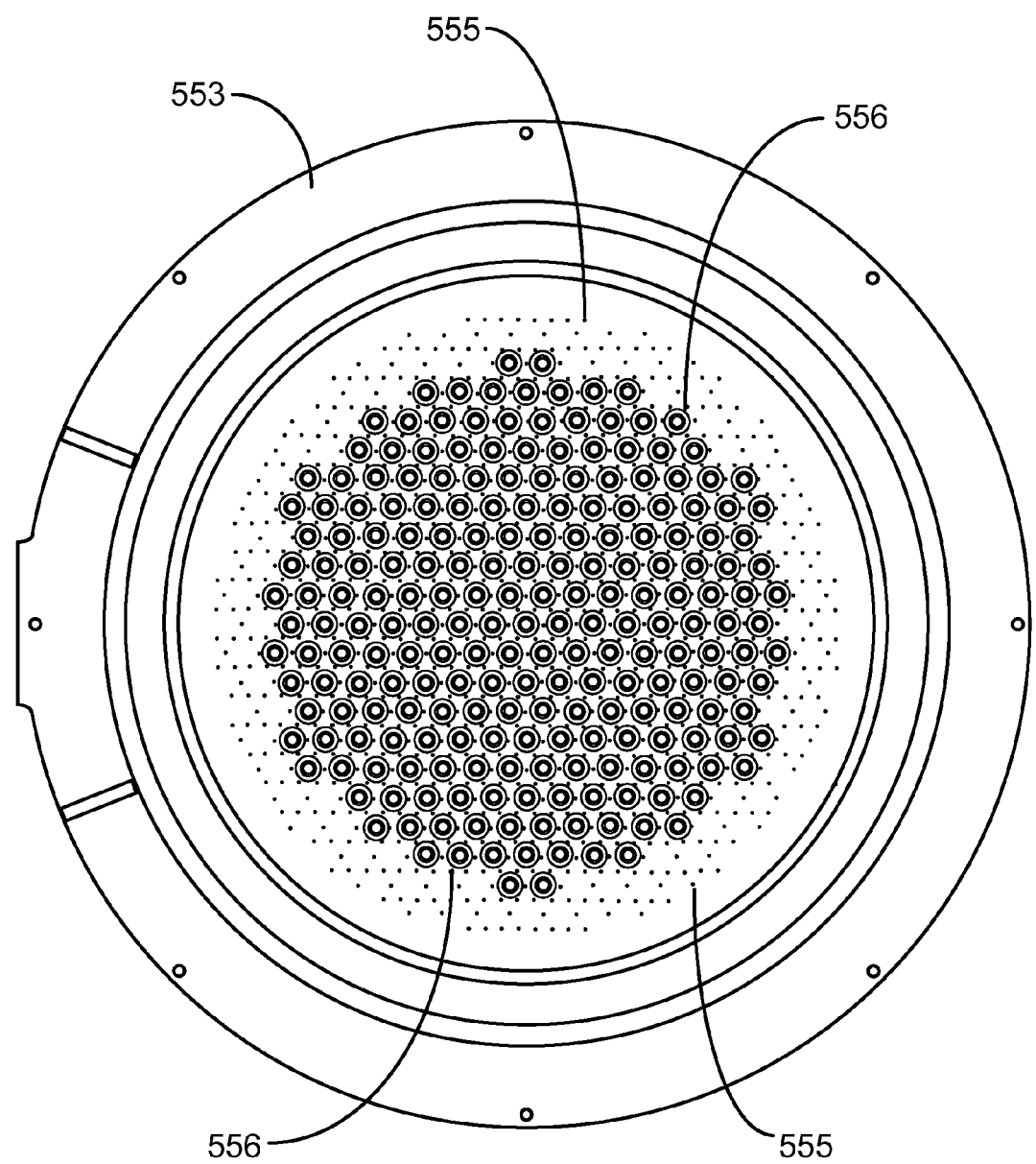
FIG. 5B is a simplified diagram of a showerhead that may be used in a substrate processing chamber to form air gaps between adjacent raised features according to embodiments of the invention.

FIG. 5B is a simplified bottom view of an exemplary showerhead 553. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. A plasma is present in chamber plasma region 520 to produce the radical-nitrogen precursor from an inflow of a nitrogen-and-hydrogen-containing gas. An AC voltage typically in the radio frequency (RF) range is applied between the conductive top portion 521 of the processing chamber and showerhead 553 to ignite a plasma in chamber plasma region 520 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The pedestal may have a heat exchange channel through which a heat exchange fluid flows to control the temperature of the substrate. This configuration allows the substrate temperature to be cooled or heated to maintain relatively low temperatures (from 0° C. through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using a single-loop embedded heater element. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards, and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language such as 68000 assembly language, C, C++, Pascal, Fortran or others. Suitable program code is entered into a single or multiple files using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Having described several embodiments, it will be recognized by those of skill in the art that various modifications, alternative constructions, combinations, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

What is claimed is:

1. A method of forming air gaps between adjacent raised features on a substrate, the method comprising:
  forming a hydrocarbon material in a bottom region between the adjacent raised features using a flowable deposition process, the hydrocarbon material being substantially free of silicon;
  forming a silicon-and-nitrogen containing film over the hydrocarbon material using a flowable chemical vapor deposition (CVD) process with a silicon precursor and a radical precursor that are substantially free of carbon, a plasma of the radical precursor generated outside a deposition region after which the radical precursor is transported to the deposition region, the radical precursor and the silicon precursor mixed in the deposition region to deposit the silicon-and-nitrogen containing film over the hydrocarbon material, the silicon-and-nitrogen containing film being substantially free of carbon and filling an upper region between the adjacent raised features and extending over the adjacent raised features; and curing the hydrocarbon material and the silicon-and-nitrogen containing material at an elevated temperature for a period of time to form the air gaps between the adjacent raised features, the elevated temperature being higher than a decomposition temperature of the hydrocarbon material, wherein the hydrocarbon material is substantially removed during the cure such that at least one of the air gaps extend from a first one of the adjacent raised features to a second one of the adjacent raised features.

2. The method of claim 1 wherein the cure includes exposure to an oxygen-containing atmosphere at the elevated temperature.

3. The method of claim 1 wherein a density of the silicon-and-nitrogen containing film increases after the cure and the silicon-and-nitrogen containing film extends over the air gaps.

4. The method of claim 1 wherein the silicon-and-nitrogen containing film includes polysilazane polymers.

5. The method of claim 1 wherein the silicon-and-nitrogen containing film includes a Si—NH—Si backbone.

6. A method of forming air gaps between adjacent raised features on a substrate, the method comprising:

forming a carbon-doped silicon oxide material in a bottom region between the adjacent raised features using a flowable deposition process;

forming a silicon-and-nitrogen containing film over the carbon-doped silicon oxide material using a flowable chemical vapor deposition (CVD) process with a silicon precursor and a radical precursor that are substantially free of carbon, a plasma of the radical precursor generated outside a deposition region after which the radical precursor is transported to the deposition region, the radical precursor and the silicon precursor mixed in the deposition region to deposit the silicon-and-nitrogen containing film being substantially free of carbon and filling an upper region between the adjacent raised features and extending over the adjacent raised features; and curing the carbon-doped silicon oxide material and the silicon-and-nitrogen containing film at an elevated temperature for a period of time to form the air gaps between the adjacent raised features, wherein the cure removes carbon from the carbon-doped silicon oxide material to provide a porous oxide and the air gap comprises one or more pores of the porous oxide.

7. The method of claim 6 wherein the cure includes exposure to an oxygen-containing atmosphere at the elevated temperature.

8. The method of claim 6 wherein the silicon-and-nitrogen containing film includes polysilazane polymers.

9. The method of claim 6 wherein the silicon-and-nitrogen containing film includes a Si—NH—Si backbone.

10. A method of forming air gaps between adjacent raised features on a substrate, the method comprising:

forming a carbon-containing material in a bottom region between the adjacent raised features using a flowable deposition process;

forming a silicon-and-nitrogen containing film over the carbon-containing material using a flowable deposition process with a silicon precursor and a radical precursor that are substantially free of carbon, a plasma of the radical precursor generated outside a deposition region after which the radical precursor is transported to the deposition region, the radical precursor and the silicon precursor mixed in the deposition region to deposit the silicon-and-nitrogen containing film over the carbon-containing material, the silicon-and-nitrogen containing film being substantially free of carbon and filling an upper region between the adjacent raised features and extending over the adjacent raised features; and curing the carbon-containing material and the silicon-and-nitrogen containing film at an elevated temperature for a period of time to form the air gaps between the adjacent raised features.

11. The method of claim 10 wherein the carbon-containing material comprises silicon, oxygen, and carbon.

12. The method of claim 10 wherein the carbon-containing material is substantially free of silicon.

13. The method of claim 10 wherein the cure includes exposure to an oxygen-containing atmosphere at the elevated temperature.

14. The method of claim 10 wherein the cure removes carbon from the carbon-containing material to provide a porous oxide and the air gaps comprises one or more pores of the porous oxide.

15. The method of claim 10 wherein the carbon-containing material is substantially removed during the cure such that at least one of the air gaps extend from a first one of the adjacent raised features to a second one of the adjacent raised features.

16. The method of claim 10 wherein after the cure the silicon-and-nitrogen containing film consists essentially of silicon, oxygen, and nitrogen.

17. The method of claim 10 wherein a density of the silicon-and-nitrogen containing film increases after the cure and the silicon-and-nitrogen containing film extends over the air gap.

18. The method of claim 10 wherein the silicon-and-nitrogen containing film includes polysilazane polymers.

19. The method of claim 10 wherein the silicon-and-nitrogen containing film includes a Si—NH—Si backbone.

20. A method of forming air gaps between adjacent raised features on a substrate, the method comprising:

forming a carbon-containing material in a bottom region between the adjacent raised features using a flowable deposition process, the carbon-containing material being substantially free of silicon; thereafter forming a silicon-and-nitrogen containing film over the carbon-containing material using a flowable chemical vapor deposition (CVD) process, the flowable CVD process comprising:

generating a plasma of a radical precursor in a plasma region;

transporting the radical precursor from the plasma region to a deposition region; and mixing the radical precursor with a silicon precursor that is substantially free of carbon in the deposition region, the radical precursor and the silicon precursor reacting to deposit the silicon-and-nitrogen containing film over the carbon-containing material, the silicon-and-nitrogen containing film being substantially free of carbon and filling an upper region between the adjacent raised features and extending over the adjacent raised features; thereafter exposing the carbon-containing material and the silicon-and-nitrogen containing material to an oxygen-containing atmosphere at an elevated temperature for a period of time to form the air gaps between the adjacent raised features, the elevated temperature being higher than a decomposition temperature of the carbon-containing material, wherein the carbon-containing material is substantially removed during the exposure such that at least one of the air gaps extend from a first one of the adjacent raised features to a second one of the adjacent raised features and the silicon-and-nitrogen containing film extends over the air gaps.

* * * * *